US010044965B2

United States Patent
Ling et al.

(10) Patent No.: US 10,044,965 B2
(45) Date of Patent: Aug. 7, 2018

(54) METHOD FOR IMAGE CAPTURE OF TFT FLAT-PANEL IMAGE SENSOR

(71) Applicant: Shanghai Oxi Technology Co., Ltd, Shanghai (CN)

(72) Inventors: Yan Ling, Shanghai (CN); Hong Zhu, Shanghai (CN)

(73) Assignee: Shanghai Oxi Technology Co., Ltd, Shanghai (CN)

( * ) Notice: Subject to any disclaimer, the term of this patent is extended or adjusted under 35 U.S.C. 154(b) by 0 days.

(21) Appl. No.: 15/550,583

(22) PCT Filed: Aug. 18, 2016

(86) PCT No.: PCT/CN2016/095847
§ 371 (c)(1),
(2) Date: Aug. 11, 2017

(87) PCT Pub. No.: WO2017/143742
PCT Pub. Date: Aug. 31, 2017

(65) Prior Publication Data
US 2018/0070039 A1    Mar. 8, 2018

(30) Foreign Application Priority Data
Feb. 26, 2016 (CN) .......................... 2016 1 0107910

(51) Int. Cl.
*H04N 5/378* (2011.01)
*H04N 5/355* (2011.01)
(Continued)

(52) U.S. Cl.
CPC ........... *H04N 5/378* (2013.01); *H01L 27/124* (2013.01); *H04N 5/32* (2013.01); *H04N 5/35572* (2013.01); *H05K 1/18* (2013.01)

(58) Field of Classification Search
CPC ......... H04N 5/378; H01L 27/124; H05K 1/18
See application file for complete search history.

(56) References Cited

U.S. PATENT DOCUMENTS

2011/0199526 A1* 8/2011 Nitta ................... H03M 1/1023
348/308
2015/0371075 A1 12/2015 Lin
2016/0041276 A1* 2/2016 Kawanabe .............. G01T 1/247
378/62

FOREIGN PATENT DOCUMENTS

CN          103050499 A     4/2013
CN          105336752 A     2/2016
(Continued)

OTHER PUBLICATIONS

International Search Report and Written Opinion from PCT/CN2016/095847, dated Nov. 30, 2016.

*Primary Examiner* — Christopher K Peterson
(74) *Attorney, Agent, or Firm* — Swanson & Bratschun, L.L.C.

(57) ABSTRACT

A method for image capture of a Thin Film Transistor (TFT) flat-panel image sensor is provided. The method for image capture includes: driving one of the plurality of scanning lines within a driving time; and collecting signals from the plurality of data lines by the signal readout chip periodically with a first period as a signal capture period; where the first period have a same time duration with the driving time, an end time point of an m-th first period coincides with a start time point of an (m+1)-th first period, where m is a positive integer, and an end time point of an n-th driving time coincides with a start time point of an (n+1)-th driving time, where n is a positive integer. The method for image capture can improve stability of the signal readout chip and reduce design difficulty of the entire circuit system.

9 Claims, 3 Drawing Sheets

(51) Int. Cl.
*H04N 5/32* (2006.01)
*H01L 27/12* (2006.01)
*H05K 1/18* (2006.01)

(56) References Cited

FOREIGN PATENT DOCUMENTS

CN         105655364 A     6/2016
WO    WO 2014/070719 A1    5/2014

\* cited by examiner

METHOD FOR IMAGE CAPTURE OF TFT FLAT-PANEL IMAGE SENSOR

CROSS-REFERENCE TO RELATED APPLICATIONS

The present application is the national phase of International Application No. PCT/CN2016/095847, filed on Aug. 18, 2016, which claims priority to Chinese patent application No. 201610107910.9, filed on Feb. 26, 2016, and entitled "METHOD FOR IMAGE CAPTURE OF TFT FLAT-PANEL IMAGE SENSOR", and the entire disclosure of which is incorporated herein by reference.

TECHNICAL FIELD

The present disclosure generally relates to TFT flat-panel image sensor field, and more particularly, to a method for image capture of a TFT flat-panel image sensor.

BACKGROUND

With the rapid development of silicon-based CMOS technology, performance and production efficiency of silicon-based CMOS circuit products have been substantially improved, and production costs of CMOS image sensor have been greatly reduced. However, production costs of CMOS image sensor can still not fully meet the market demand. As for CMOS image sensors, the current largest wafer for silicon-based CMOS process is 12 inches, while a 12-inch production line is still relatively high in production costs. 8-inch production line is relatively low in cost, however production costs of which are still too high for the market demand.

The cost of Thin Film Transistor (TFT) image sensor can be lowered further due to substrates in production lines of TFT process are relatively large, like 1 m×1 m, or even up to 3 m×3 m or so. The larger the substrate, the more individual products that can be cut, and then the lower the final cost of a single product.

In the field of image sensors, in order to reduce cost and size of a sensor, an optical signal image is usually focused through a focusing lens to become a small image and then a photoelectric conversion is performed, which is a method for image capture of the traditional CMOS sensor and CCD sensor and so on.

However, in some fields, in order to improve an image performance and optimize a structural design, imaging can not be performed using a focus lens but be performed with a ratio of 1 to 1, such as imaging in an X-ray flat-panel image sensor. The "flat-panel" herein means that an incident light signal has not been focused, but been directly imaged with the ratio of 1 to 1.

The commonly used X-ray flat-panel image sensors usually have a large pixel area, which may reach 17 inches by 17 inches. If the CMOS image sensors are applied to manufacture the X-ray flat-panel image sensors, a plenty of small sensors will be required to be joint together, then the cost will be very high. The costs can be greatly reduced by using the TFT flat-panel image sensors.

The optical fingerprint sensor as commonly used consumer goods has requirements for lower cost and a thinner structure, thus the focus lens are not usually applied, while a flat-panel-like image sensor may be used instead. Therefore, an optical fingerprint sensor product which uses the TFT flat-panel image sensor has already been produced.

The TFT flat-panel image sensor is based on a substrate (e.g., glass, stainless steel, or plastic etc.), and a pixel array and a peripheral circuit may be manufactured through amorphous Silicon Thin Film Transistor (a-Si TFT), Low Temperature Poly Silicon Thin Film Transistor (LTPS TFT) or Oxide Semiconductor Thin Film Transistor (OSTFT) technology.

However, the TFT has a poor performance compared with the Si-based CMOS. Therefore, in the flat-panel image sensors produced by TFT technology, pixel signal amplification and digital-analog conversion function are usually achieved through an external chip, where the external chip is usually referred to as a signal readout chip, which may include a Readout Integrated Circuit (ROIC). That is, pixel electronic signals of the TFT flat-panel image sensor are connected to an external signal readout chip through data lines, and the signal readout chip performs an electronic conversion and signal processing so as to realize image capture. External laying ways of the signal readout chip can be mainly divided into three cases: in the first case, the signal readout chip is directly bonded to the TFT flat-panel image sensor in a Chip On Glass (COG) way; in the second case, the signal readout chip is directly bonded on a Flexible Printed Circuit (FPC) board, and then the FPC board is bonded to the TFT flat-panel image sensor; and in the third case, the signal readout chip is directly bonded on a rigid Printed Circuit Board (PCB), and then the rigid PCB is bonded to the TFT flat-panel image sensor via another FPC board.

FIG. 1 schematically illustrates a TFT flat-panel image sensor in a conventional technology. The TFT flat-panel image sensor may include a substrate 10, a signal readout chip (not shown), and a device layer (not shown) on the substrate 10. The device layer is manufactured on the substrate 10, and the substrate 10 may be made of glass, stainless steel, or plastic. The device layer may include a pixel array region and a peripheral circuit region, and may be manufactured through processes like amorphous silicon TFT technology, low-temperature poly silicon TFT technology, or oxide semiconductor TFT technology. The pixel array region has a plurality of data lines 11 and a plurality of scanning lines 12, the plurality of data lines 11 and the plurality of scanning lines 12 define a grid including a plurality of lattices arranged in array, and there is a pixel 13 in each lattice of the grid. The pixel 13 includes at least one pixel switch 131 (the pixel switch 131 is usually a TFT device), and at least one sensing device 132 (such as a photosensitive device, an electrode plate, or a thermosensitive device, etc.). The at least one sensing device 132 is applied to collect external input signals (such as light, electrostatic fields, heat, etc.), convert the external input signals into an electronic signal and then store the electronic signal in the pixel 13. When the at least one pixel switch 131 is turned on, the electrical signal in the at least one sensing device 132 is transmitted to the data line 11, and then the external signal readout chip performs signal capture. The plurality of scanning lines are controlled by a peripheral driving circuit to realize a row-by-row opening of the at least one pixel switch 131, where the peripheral driving circuit may be an external driving chip or be integrated into the device layer in a TFT device circuit form. Connection ways of the external driver chip can also be divided into three cases: in the first case, the external driver chip is directly bonded to a periphery of a TFT flat-panel image sensor; in the second case, the external driver chip is directly bonded on a flexible printed circuit board, and then the flexible printed circuit board is bonded to the TFT flat-panel image sensor; and in the third case, the external driver chip is directly bonded on a rigid printed circuit board, and then the rigid printed circuit board is bonded to the TFT flat-panel image sensor through another flexible printed circuit board.

Therefore, there is a need to improve a method for image capture of the TFT flat-panel image sensor in the conventional technology.

SUMMARY

A method for image capture of a TFT flat-panel image sensor is provided in the present disclosure, so as to improve stability of a signal readout chip and reduce design difficulty of an entire circuit system. The TFT flat-panel image sensor includes: a substrate, a signal readout chip, and a device layer on the substrate; the device layer including a plurality of pixels arranged in an array, a plurality of data lines and a plurality of scanning lines, pixel switches connected with each of the plurality of pixels in a column being connected with a same data line, and pixel switches connected with each of the plurality of pixels in a row being connected with a same scanning line; wherein the method for image capture includes: driving one of the plurality of scanning lines within a driving time; and collecting signals from the plurality of data lines by the signal readout chip periodically with a first period as a signal capture period; where the first period has a same time duration with the driving time, an end time point of an m-th first period coincides with a start time point of an (m+1)-th first period, where m is a positive integer, and an end time point of an n-th driving time coincides with a start time point of an (n+1)-th driving time, where n is a positive integer.

Optionally, the first period includes a first operation time period, a second operation time period and a third operation time period, and the method further includes: performing a data line signal clearing operation during the first operation time period; performing a first signal sampling operation during the second operation time period; and performing a second signal sampling operation during the third operation time period; wherein an i-th first period starts before an i-th driving time, and an interval between a start time point of the i-th first period and a start time point of the i-th driving time is less than a time duration of the i-th first period and a time duration of the i-th driving time, where i is a positive integer; and the first operation time period and the second operation time period of a j-th first period falls into a (j−1)-th driving time, and the third operation time period of the j-th first period falls into a j-th driving time, wherein j is an integer greater than or equal to 2.

Optionally, the method for image capture further includes controlling, by a scanning line corresponding to a (k−1)-th driving time, pixel switches of a corresponding row to remain in an on-state during the first operation time period of a k-th first period, so that a signal clearing operation can be performed to pixels in the corresponding row during the first operation time period of the k-th first period, where k is an integer greater than or equal to 2.

Optionally, the method for image capture further includes performing, by the signal readout chip, a subtraction between a signal obtained by the second signal sampling operation and a signal obtained by the first signal sampling operation to obtain a difference, and outputting the difference as a final signal.

Optionally, the first period further includes a signal release time period after the second operation time period and before the third operation time period.

Optionally, there is a first interval time between a start time point of the first period and the first operation time period, there is a second interval time between the first operation time period and the second operation time period, there is a third interval time between the second operation time period and the third operation time period, there is a fourth interval time between the third operation time period and an end time point of the first period; and the signal release time period falls into the third interval time.

Optionally, during the signal release time period, 80% or more of electronic signals in pixels of a corresponding row are transmitted to the signal readout chip.

Optionally, a driving circuit of the plurality of scanning lines is an external driving chip or is integrated in the device layer in a TFT device circuit form.

Optionally, the signal readout chip is directly bonded to the substrate in a Chip On Glass (COG) way, or the signal readout chip is bonded to an external printed circuit board electrically connected with the TFT flat-panel image sensor.

Optionally, the external driving chip is directly bonded to the substrate in a COG way, or the external driving chip is bonded to an external printed circuit board electrically connected with the TFT flat-panel image sensor.

Compared with a conventional technology, the present disclosure has the following advantages:

In the method for image capture of a TFT flat-panel image sensor, one of the plurality of scanning lines is driven within a driving time; and signals are collected from the plurality of data lines by the signal readout chip periodically with a first period as a signal capture period; the first period have a same time duration with the driving time; an end time point of an m-th first period coincides with a start time point of an (m+1)-th first period, where m is a positive integer; and an end time point of an n-th driving time coincides with a start time point of an (n+1)-th driving time, where n is a positive integer. With the method in the present disclosure, the first period and the driving time can cooperate with each other, so that when a row of pixel switches are switched from on-state to off-state, another line of pixel switches can be switched from off-state to on-state, and electrons sucked when the pixel switches are turned on can mostly come from electrons released when the pixel switches are turned off. Therefore, the sucked electrons and the released electrons almost cancel each other out, which can minimize amount of the electrons sucked or released when the pixel switches are turned on or turned off, reduce charge impact of the pixel switches on the signal readout chip, improve the stability of the signal readout chip and reduce the design difficulty of the entire circuit system.

DETAILED DESCRIPTION

Figure 1:
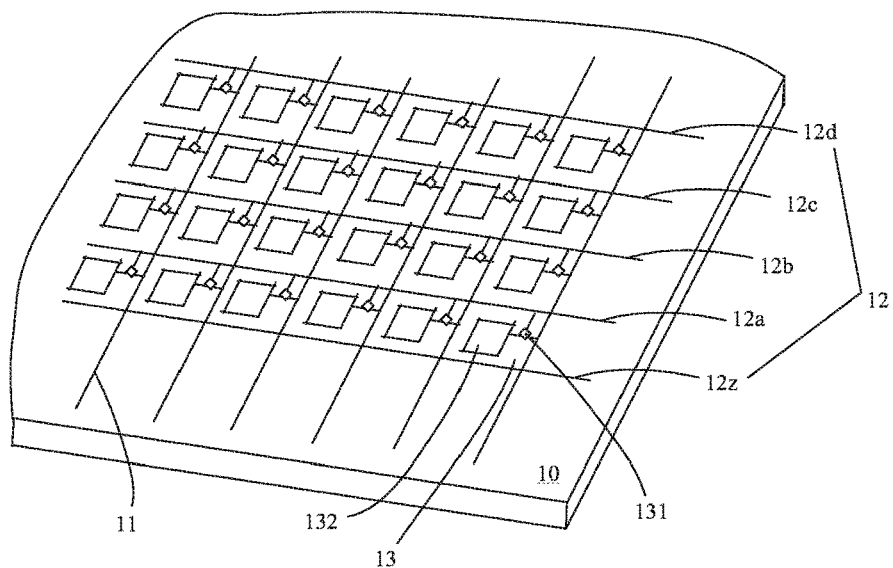
FIG. 1 schematically illustrates a structural diagram of a portion of a TFT flat-panel image sensor in a conventional technology.
Figure 2:
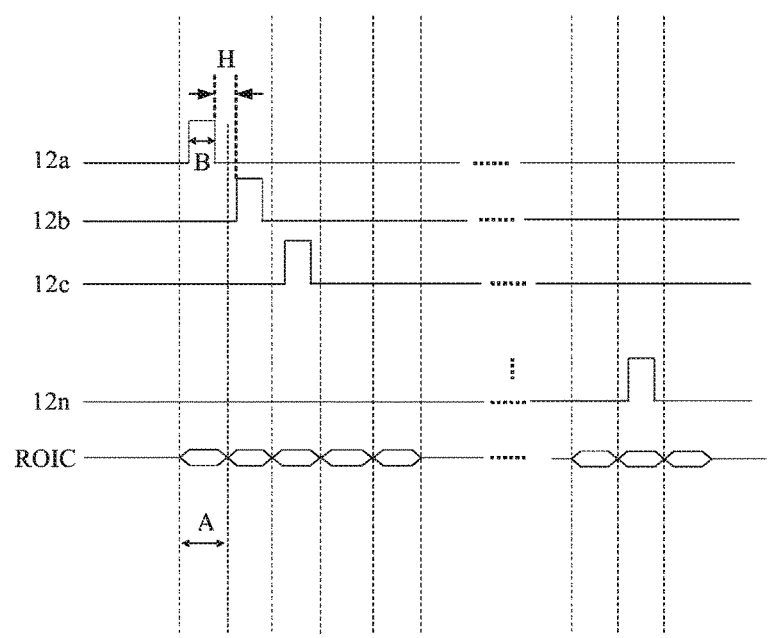
FIG. 2 schematically illustrates a driving time sequence diagram of the TFT flat-panel image sensor shown in FIG. 1 which uses a method for image capture in the conventional technology.

FIG. 2 schematically illustrates a driving time sequence diagram of the TFT flat-panel image sensor in FIG. 1 which uses a method for image capture in a conventional technology (the driving time sequence diagram includes driving time sequences of a plurality of scanning lines 12 and driving time sequences of a signal readout chip), and the plurality of scanning lines 12 (FIG. 1 shows a scanning line 12z, a scanning line 12a, a scanning line 12b, a scanning line 12c, and the scanning line 12d, and FIG. 2 shows the scanning line 12a, the scanning line 12b, the scanning line 12c and an n-th scanning line 12n which is not shown in FIG. 1) are selected row by row, each of the plurality of scanning lines 12 has a driving time B, and the signal readout chip (labeled as ROIC in the driving time sequence diagram) has a signal capture period which is referred to as a first period A. A driving time of the scanning line 12a is prior to a driving time of the scanning line 12b, and a driving time of the scanning line 12b is prior to a driving time of the scanning line 12c. The signal readout chip corresponding to a signal line ROIC in FIG. 2 is configured to perform signal capture row by row.

Figure 3:
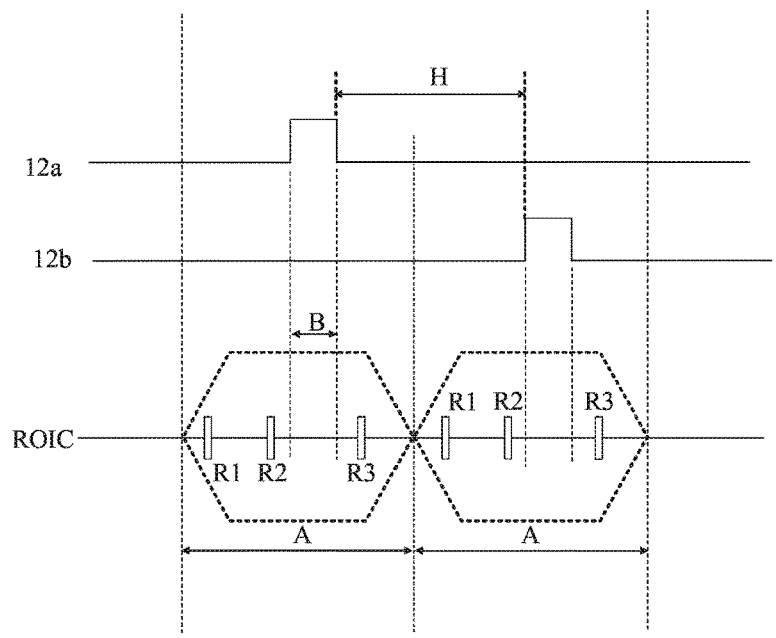
FIG. 3 schematically illustrates specific time included in a first period of FIG. 2.

Referring to FIG. 3, FIG. 3 schematically illustrates more specific time sequence diagram of the signal readout chip and the plurality of scanning lines 12 (two adjacent scanning lines including the scanning line 12a and the scanning line 12b specifically), time in each part of the first period A is shown, and situations for other scanning lines can be derived by analogy.

As shown in FIG. 3, a signal capture period of the signal readout chip generally includes three operations, namely, a data line signal clearing operation in a first operation time period R1; a first signal sampling operation in a second operation time period R2; and a second signal sampling operation in a third operation time period R3.

As shown in FIG. 3, the plurality of scanning lines 12 are turned on row by row, and a driving time B of one of the plurality of scanning lines 12 falls into a first period A of the signal readout chip. There is a time interval H between driving time periods of two adjacent scanning lines turned on in sequence (as shown in FIG. 2), that is, driving times B of the two adjacent scanning lines 12 are not continuous in time. Each driving time B is after the second operation time period R2 and before the third driving time R3.

Since a large amount of charges will be sucked or released by a plurality of data lines 11 when a plurality of pixel switches 131 connected with one of the plurality of scanning lines 12 (the pixel switch 131 is a TFT device as described above) are turned on or turned off. In many cases, the sucked or released charges are far greater than image signals generated by the plurality of pixels 13 themselves. Further, when the plurality of pixel switches 131 are turned on or turned off, in order to prevent a signal loss, an internal circuit of the signal readout chip needs to be continuously connected with the plurality of data line 11. Therefore, the charge sucking or releasing of the plurality of pixel switches 131 are directly related to the internal circuit of the signal readout chip, so that turning on and turning off of the plurality of pixel switches 131 may have a large charge impact on the signal readout chip, which may further affect stability and response speed of the signal readout chip.

When a pixel size of the TFT flat-panel image sensor is small (for example, the pixel size is only about 50 μm), or an input image signal is small (for example, a low-dose dynamic X-ray sensor), a pixel signal (i.e. an electronic signal) will be small. In order to achieve a sufficient signal output, the signal readout chip needs to be designed to be very sensitive, so as to amplify the input image signal greatly. However, the more sensitive the signal readout chip is, the less charge amount of charge impact the signal readout chip can hold, resulting in that the signal readout chip is more susceptible to the charge impact during the turning on or turning off of the plurality of pixel switches 131, that is, the worse the stability of the signal readout chip is.

Based on the above, a method for image capture of a TFT flat-panel image sensor is provided in the present disclosure, which can reduce charge impact of pixel switches on a signal readout chip, improve stability of the signal readout chip, and reduce design difficulty of the entire circuit system through cooperation between driving time sequences of scanning lines and driving time sequences of the signal readout chip.

The foregoing objects, features and advantages of the present invention will become more apparent from the following detailed description of specific embodiments of the present invention taken in conjunction with the accompanying drawings.

Figure 4:
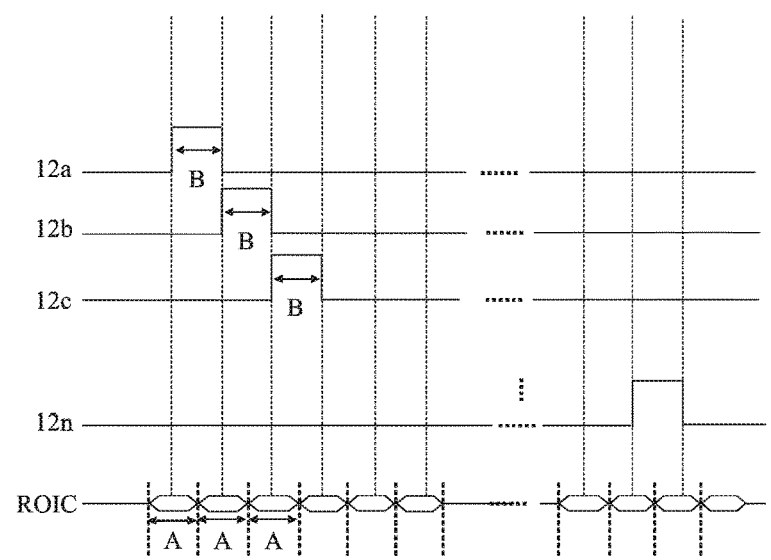
FIG. 4 schematically illustrates a driving time sequence diagram of the TFT flat-panel image sensor shown in FIG. 1 which uses a method for image capture according to embodiments of the present disclosure.
Figure 5:
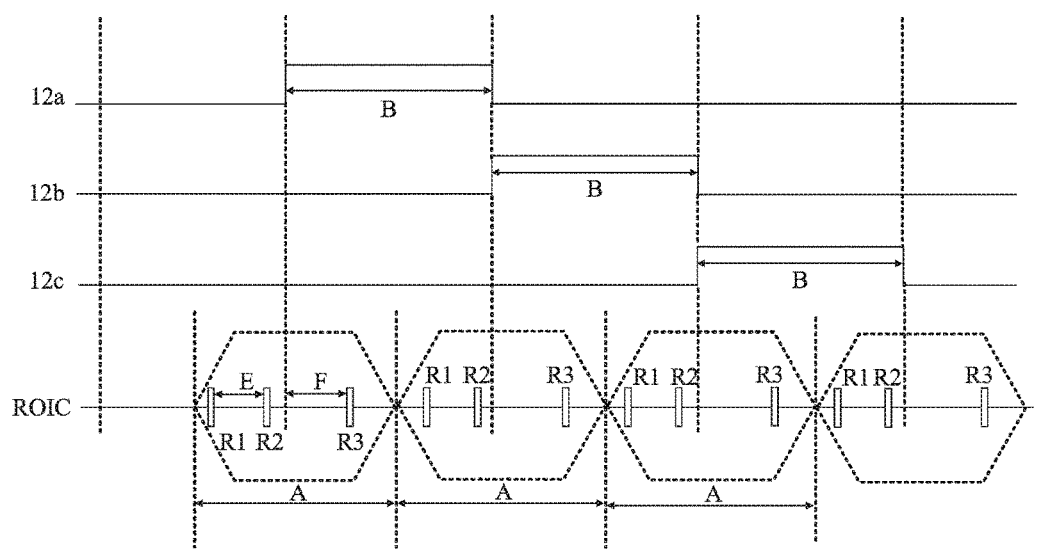
FIG. 5 schematically illustrates specific time included in a first period of FIG. 4.

A method for image capture of a TFT flat-panel image sensor is provided according to embodiments of the present disclosure, and reference can be made to FIGS. 1, 4 and 5.

Structure of the TFT flat-panel image sensor may be referred to FIG. 1 and description in the background art. The TFT flat-panel image sensor includes a substrate 10, a signal readout chip (not shown), and a device layer (not shown) on the substrate 10. The substrate 10 may be made of glass, stainless steel, or plastic, and the device layer may be made by amorphous silicon TFT technology, low temperature poly silicon TFT technology, or oxide semiconductor TFT technology. The device layer includes a plurality of pixels 13 arranged in an array, a plurality of data lines 11 and a plurality of scanning lines 12.

In the present embodiment, the device layer includes a pixel array region, and the pixel array region refers to a region where a plurality of pixels 13 are located. The plurality of pixels 13 are applied to absorption of optical signals, conversion and temporary store of electronic signals. A plurality of data lines 11 and a plurality of scanning lines 12 define a grid including a plurality of lattices (not shown), and each of the plurality of pixels 13 is located in a lattice of the grid. Each of the plurality of pixel 13 includes at least one pixel switch 131 (the at least one pixel switch 131 is generally a TFT device), and at least one sensing device 132 (such as a photosensitive device, an electrode plate, or a thermosensitive device, etc.). The at least one sensing device 132 is configured to collect external input signals (such as light, electrostatic field, or heat, etc.), convert the external input signals into an electronic signal and then store the electronic signal in the each of the plurality of pixel 13. When the at least one pixel switch 131 is turned on, the electrical signal in the at least one sensing device 132 is transmitted to the plurality of data lines 11, and then the external signal readout chip performs signal capture. The plurality of scanning lines 12 are controlled by a peripheral driving circuit to realize an opening of the pixel switches 131 row by row, where the peripheral driving circuit may be an external driving chip or be integrated into the device layer in a TFT device circuit form.

In the present embodiment, depending on different kinds of the sensing device 132, the TFT flat-panel image sensor may be, but not limited to, an optical image sensor (including an optical fingerprint sensor etc.), an X-ray flat-panel image sensor, or other flat-panel image sensors based on amorphous silicon, low-temperature poly silicon, or oxide semiconductor.

In the present embodiment, when the TFT flat-panel image sensor is an optical fingerprint sensor, each of the plurality of pixels 13 may have a light-transmitting area and a light-blocking area. The light-blocking area may include a light-sensitive element 132, and the light-transmission area enables light to pass through the TFT device layer. In other embodiments, each of the plurality of pixels 13 may also be a light-blocking area, where usual visible light may not pass through the TFT device layer.

When the TFT flat-panel image sensor is an X-ray flat-panel image sensor, especially a low-dose dynamic X-ray sensor, as described above, the corresponding signal readout chip needs to be designed to be very sensitive, so that the input signal can be greatly amplified. Since X-ray may hurt human body to some extent, X-ray irradiation on the human body within a unit time can not be too much, that is, X-ray with high intensity can not be applied; and X-ray irradiation during a long time (such as one year) can not be too high, that is, X-ray with low intensity can not be applied to irradiation for a long time. Normally, when only one X-ray image is taken (such as chest X-ray image or other static X-ray image), X-ray intensity could be larger, and a static X-ray sensor may be used; and when a plurality of X-ray images need to be taken continuously, such as a dynamic real-time monitoring during an interventional surgery (e.g., a cardiac surgery, or radiotherapy pre-positioning, etc.), dozens of or hundreds of X-ray images need to be taken continuously, then there is need to control a total amount of X-ray irradiation, therefore intensity of each X-ray image should be very low, only a few tenths of a static X-ray image, and the sensor used under this condition may be referred to as a low-dose dynamic X-ray sensor.

In the present embodiment, five of the scanning lines 12 are illustrated in FIG. 1 for representation (a total number of the scanning lines 12 may be more). The five of the scanning lines 12 may be a scanning line 12z, a scanning line 12a, a scanning line 12b, a scanning line 12c and a scanning line 12d, respectively.

The scanning line 12z is a dummy scanning line and is located at a lowermost (or outermost) side of all the scanning lines 12, to ensure that pixels 13 in the lowermost (or outermost) row is in a same structural environment with pixels 13 in other rows.

In the present embodiment, the substrate 10 may be a light-transmissive substrate or a light-blocking substrate. The substrate 10 may have a material of glass, plastic, or stainless steel and so on.

In the present embodiment, each of the plurality of pixels 13 may further include at least one pixel switch 131 and at least one sensing device 132, where the at least one sensing device 132 may be, for example, a photosensitive device, an electrode plate, or a thermosensitive device, etc., a photosensitive device is selected in the present embodiment, and the photosensitive device may include a photodiode. The pixel switch 131 may generally be a TFT device (a TFT switch).

The at least one sensing device 132 may be applied to collect an external input signal (such as light, electrostatic fields, and heat, etc.), convert the external input signal into an electronic signal, and then store the electronic signal in each of the plurality of pixels 13. When the at least one pixel switch 131 is turned on (turning on and turning off of the at least one pixel switch 131 is controlled by a corresponding scanning line 12), the electronic signal in each of the plurality of pixel 13 is transmitted to a corresponding data line 11 and then transmitted to an external signal readout chip, to achieve a image signal capture.

In the present embodiment, the device layer (the device layer is fabricated by various TFT processes, thus the device layer may also be referred to as a TFT device layer) may further include a peripheral circuitry. The peripheral circuitry may include at least a drive circuit, a signal readout chip binding region (not shown), a flexible printed circuit board binding region, and connecting wires (not shown in FIG. 1) between the signal readout chip binding region and the flexible printed circuit board binding region.

In some embodiments, the device layer may be fabricated by a semiconductor process such as amorphous silicon TFT process, low-temperature poly silicon TFT process, or oxide semiconductor TFT process.

It should be noted that, in other embodiments, the signal readout chip may be directly bonded to the substrate 10 in a COG way (a binding position may be located on the device layer of the substrate 10 or not), so that the signal readout chip can be electrically connected with the data lines 11.

In other embodiments, the signal readout chip may also be electrically connected with the data lines 11 on the substrate 10 by being bonded to a corresponding external printed circuit board. The connection ways can be divided into two cases: in the first case, the signal readout chip is directly bonded to a flexible printed circuit board, and then the flexible printed circuit board is bonded to the TFT flat-panel image sensor; in the second case, the signal readout chip is directly bonded to a rigid printed circuit board, and then the rigid printed circuit board is bonded to the TFT flat-panel image sensor via another flexible printed circuit board.

In the present embodiment, as shown in FIG. 1, pixel switches 131 connected with each of the plurality of pixels 13 in a column are connected with a same data line 11. And pixel switches 131 connected with each of the plurality of pixels 13 in a row are connected with a same scanning line.

The pixel switches 131 connected with each of the plurality of pixels 13 in a row are connected with a same scanning line, so that the pixel switches 131 connected with each of the plurality of pixels 13 in a row can be driven and controlled by the same scanning line. That is, the pixel switches 131 connected with each of the plurality of pixels 13 in a row being in an on-state or an off-state, or being switched between the on-state and the off-state, are driven and controlled by the same scanning line. Since the pixel switches 131 are generally a TFT device, it is only necessary to ensure that gates of the pixel switches 131 connected with each of the plurality of pixels 13 in a row are connected with the same scanning line 12, then it can be achieved that, the pixel switches 131 connected with each of the plurality of pixels 13 in a row are driven and controlled by the same scanning line.

Referring to FIG. 4, FIG. 4 schematically illustrates a driving time sequence diagram corresponding to an image capturing method of the TFT flat-panel image sensor in FIG. 1 (the driving time sequence diagram includes driving time sequences of the scanning lines and a driving time sequence of the signal readout chip). It should be noted that, the scanning line 12z, the scanning line 12a, the scanning line 12b, the scanning line 12c, and the scanning line 12d are shown in FIG. 1, while a driving time sequence of the scanning line 12a, a driving time sequence of the scanning line 12b, a driving time sequence of the scanning line 12c, and a driving time sequence of the n-th scanning line 12*n* not shown in FIG. 1 are shown in FIG. 4.

The method for image capture may include: driving a scanning line 12 within a driving time; and collecting signals from the plurality of data lines 11 by the signal readout chip periodically with a first period A as a signal capture period; where the first period A have a same time duration with the driving time B, an end time point of an m-th first period A coincides with a start time point of an (m+1)-th first period A (i.e., there is no time interval between the m-th first period A and the (m+1)-th first period A), where m is a positive integer, and an end time point of an n-th driving time B coincides with a start time point of an (n+1)-th driving time B (i.e., there is no time interval between the n-th driving time B and the (n+1)-th driving time B), where n is a positive integer; and an i-th first period A starts before an i-th driving time B, a start time interval between the i-th first period A and the i-th driving time B (i.e., a time difference between start moments of the i-th first period A and the i-th driving time B) is less than a time duration of the i-th first period A and a time duration of the i-th driving time B, where i is a positive integer. For example, when i is equal to 1, the first period A starts before the first driving time B, and a start time interval between the first period A and the first driving time B is less than a time duration of the first period A and a time duration of the first driving time B.

With the aforementioned method, the first period A and the driving time B in the present embodiment have a same time duration but a different start time point, and a start time point of each driving time B falls in the first period A. That is, the scanning lines 12 in the present embodiment are turned on row by row. In some embodiments, turning on sequence of the scanning lines 12 may depend on row sequence of the scanning lines 12 in structure, that is, the scanning lines 12 in adjacent rows are turned on in sequence. In other embodiments, turning on time of the scanning lines 12 may be independent of row sequence of the scanning lines 12, and it is only necessary to ensure that another row of scanning line 12 will be turned on once a row of scanning line 12 is turned off. The signal readout chip performs signal capture successively, but the scanning lines 12 and the signal readout chip are not completely coincident with each other in time.

By turning the scanning lines 12 on row by row, and ensuring that the adjacent rows are not overlapped with each other (i.e., driving times B of different scanning lines are not overlapped with each other), the pixel signals of different rows can be prevented from interfering with each other; and by further ensuring that there is no time interval between the scanning lines 12 being turned on in sequence (an end time point of a previous row is exactly a start time point of a current row), that is, when the pixel switches 131 in the previous row are turned off, the pixel switches 131 in the current row are exactly turned on, then it can be realized that, when the pixel switches 131 of different rows are turned on or turned off, charges sucked from the data lines 11 by one row of pixel switches 131 and charges released to the data lines 11 by another row of pixel switches 131 basically cancel each other out, or the charges released to the data lines 11 by one row of pixel switches 131 is roughly equal to the charges sucked from the data lines 11 by another row of pixel switches 131.

Although speed and number (charge quantity) of electron releasing and electron sucking by pixels switches 131 of different rows can not be exactly the same, when one row of pixels switches 131 are turned on, another row of pixel switches 131 are just turned off, then most of the charges can be canceled out by each other.

Referring to FIG. 5, in the present embodiment, the first period A includes: a first operation time period R1 (indicated by a first rectangle in the first period A) for performing a data line 11 signal clearing operation; a second operation time period R2 (indicated by a second rectangle in the first period A) for performing a first signal sampling operation; and a third operation time period R3 (indicated by a third rectangle in the first period A) for performing a second signal sampling operation.

There is a first interval time (not shown) between a start time point of the first period A and the first operation time period R1, a second interval time E between the first operation time period R1 and the second operation time period R2, a third interval time (not shown) between the second operation time period R2 and the third operation time period R3, and a fourth interval time (not shown) between the third operation time period R3 and an end time point of the first period A.

During the first operation time period R1, residual signals of a last row of pixels 13 on the data line 11 and circuit of the signal readout chip are cleared and signal capture of a next row is prepared, so as to ensure that signal sampled by the subsequent second operation time period R2 is stable and consistent.

During the second operation time period R2, a background signal is sampled and applied to a subsequent operation such as a subtraction with a pixel composite signal etc., so as to subtract influence of the background signal on a final signal.

Signals (i.e., the pixel composite signal) sampled in the third operation time period R3 include the background signal sampled in the second operation time period R2 and pixel output signals.

In the present embodiment, a first signal sampling is started when the first operation time period R1 is completed and after the second interval time E, i.e., the second operation time period R2 is entered. Length of the second interval time E may depend on design of the signal readout chip and parasitic parameters (e.g., capacitance and resistance, etc.) of the data line 11. One purpose of setting the second interval time E is to stabilize circuit of the signal readout chip, so that the first signal sampling operation during the subsequent second operation time period R2 can be performed steady and effectively.

In the present embodiment, the first period A further includes a signal release time period F after the second operation time period R2 and before the third operation time period R3. And in the present embodiment, the third interval time includes the signal release time period F, that is, the signal release time period F is a part of the third interval time.

In the present embodiment, the signal readout chip performs a subtraction between signal (i.e., the aforementioned pixel composite signal) sampled in the third operation time period R3 and signal sampled in the second operation time period R2 (i.e., the aforementioned background signal) to obtain a final signal, and then outputs the final signal, to achieve transformation of analog signals into digital signals. Purpose of the two samples is to remove a low frequency noise of a front analog circuit system of a sensor (including an internal analog circuit of the signal readout chip, data lines 11 and pixel circuit, etc.) and differences among channels within the signal readout chip, etc., to increase a signal to noise ratio of the sampled fingerprint image. That is, the signal readout chip performs a subtraction between the signal obtained in the second signal sampling operation and the signal obtained in the first signal sampling operation, to obtain a final signal to output, so that the final signal is of higher accuracy.

In the present embodiment, it is only necessary to ensure that the signal release time period F is sufficient for 80% or more of the electronic signals of pixels 13 in a corresponding row to be transmitted to the signal readout chip. In theory, according to a principle of RC charging circuit (that is, a principle of resistance-capacitance charging circuit), a time needed for all electronic signals to get out is infinite, thus in an actual application it is sufficient as long as the pixels release enough signals. In the present embodiment, it is sufficient when 80% or more of the electronic signals are transmitted to the signal readout chip.

In the present embodiment, a first operation time period R1 and a second operation time period R2 of the j-th first period A fall into the (j−1)-th driving time B, and a third operation time period R3 of the j-th first period A falls into the j-th driving time B, wherein j is an integer greater than or equal to 2.

For example, when j is equal to 2, the above process is: a portion of (approximately a latter portion of a first driving time B) the first driving time B (corresponding to a driving time B of 12a in FIG. 5) is corresponding to a first operation time period R1 and a second operation time period R2 of a 2nd first period A; a third operation time period R3 of the 2nd first period A is corresponding to a portion of (approximately a front portion of a second driving time B) the second driving time B (corresponding to a driving time B of 12b in FIG. 5); and when j is equal to 3, the above-described process is: a portion of (approximately a latter portion of a second driving time B) the second driving time B (corresponding to a driving time B of 12b in FIG. 5) is corresponding to a first operation time period R1 and a second operation time period R2 of a 3rd first period A; a third operation time period R3 of the 3rd first period A is corresponding to a portion of (approximately a front portion of a third driving time B) the third driving time B (corresponding to a driving time B of 12c in FIG. 5); and the process for j greater than 3 can be derived by analogy.

FIG. 5 schematically illustrates cooperation between a driving time of the scanning lines and signal reading of the signal readout chip. During a first operation time period R1 of a k-th first period A, the method for image capture further includes controlling pixel switches 131 of a corresponding row to remain in an on-state by a scanning line 12 corresponding to a (k−1)-th driving time B, where k is an integer greater than or equal to 2, so that signals of the pixels 13 of the corresponding row can be cleared at the same time of the first operation time period R1.

For example, during a first operation time period R1 of the $2^{nd}$ (i.e., k is equal to 2) first period A, the method for image capture includes controlling pixel switches 131 of a corresponding row to remain in an on-state by a scanning line 12a corresponding to the first driving time B, so that signal clearing operation can be performed to the pixels 13 of the corresponding row at the same time of the first operation time period R1. During a first operation time period R1 of the $3^{rd}$ first period A, the method for image capture includes control the pixel switch 131 of a corresponding row to remain in the on-state by a scanning line 12b corresponding to the second driving time B, so that signals of the pixels 13 of the corresponding row can be cleared at the same time of the first operation time period R1.

It should be noted that, an n-th scanning line 12 and an (n+1)-th scanning line 12 do not refer to two scanning lines adjacent in position, but represent two scanning lines of which turning on time periods are adjacent in time sequence. That is, the n-th scanning line 12 and the (n+1)-th scanning line 12 may be two adjacent scanning lines 12 in position or two scanning lines 12 separated by one or more rows of scanning lines.

With the above settings, the first period A and the driving time B of each scanning line 12 in the present embodiment can cooperate with each other.

In the present embodiment, a row driving function of the pixels 13 (i.e., driving of the scanning lines 12) is relatively simple and can be realized by an external driving chip, namely, scanning lines of the pixel array region are connected with the external driving chip. However, since the fingerprint recognition does not have a high requirement on image capturing speed, driving signal of row scanning can be generated by a corresponding TFT device circuit. Thus, a driving circuit of the scanning lines 12 may be integrated in a device layer in a TFT device circuit form. When a driving circuit of the scanning lines 12 is an external driving chip, the external driving chip may be directly bonded to the substrate 10 in a COG way, so as to be electrically connected with the scanning lines 12, or be bonded to a corresponding external printed circuit board so as to be electrically connected with the scanning lines 12 on the substrate 10. Conditions for the external driving chip being bonded to the corresponding external printed circuit board can be divided into two cases: in the first case, the external driving chip is directly bonded to a flexible printed circuit board, and then the flexible printed circuit board is bonded to the TFT flat-panel image sensor; in the second case, the external driving chip is directly bonded to a rigid printed circuit board, and then the rigid printed circuit board is bonded to the TFT flat-panel image sensor through another flexible printed circuit board.

In the TFT flat-panel image sensor of the present embodiment, when a pixel switch 131 (as described above, usually a TFT device) is switched from on-state to off-state, a channel layer of the pixel switch 131 needs to release electrons to circuits connected with drain and source of the pixel switch 131 (i.e., data lines etc.); when the pixel switch 131 is switched from off-state to on-state, the pixel switch 131 needs to suck electrons from the circuits connected with the drain and the source and inject the electrons into the channel layer of the pixel switch 131. Therefore, when the pixel switch 131 is turned off or turned on, the pixel switch 131 will release electrons to or suck electrons from the signal readout chip, thereby generating a charge impact on the signal readout chip and affecting stability of the signal readout chip.

With the method for image capture in the present embodiment, the first period A and the driving time B can cooperate with each other, so that when a row of pixel switches 131 are switched from on-state to off-state, another row of pixel switches 131 are switched from off-state to on-state, electrons sucked when the pixel switches 131 are turned on can be basically derived from electrons released when the pixel switches 131 are turned off, thereby realizing a mutual cancellation of the sucked electrons and the released electrons. Therefore, amount of electrons sucked or released when the pixel switches 131 are turned on or turned off can be minimized, charge impact of the pixel switches 131 on the signal readout chip can be reduced, stability of the signal readout chip can be improved, and design difficulty of the entire circuit system can be reduced.

Although the present disclosure has been described above, the present disclosure is not limited thereto. It should be understood by those skilled in the art that various changes and modifications may be made without departing from the spirit and scope of the disclosure, and therefore, the scope of the disclosure should be limited by the scope of the claims.

What is claimed is:

1. A method for image capture of a Thin Film Transistor (TFT) flat-panel image sensor, where the TFT flat-panel image sensor comprises:

a substrate, a signal readout chip, and a device layer on the substrate; and the device layer comprises a plurality of pixels arranged in an array, a plurality of data lines and a plurality of scanning lines, pixel switches connected with each pixel in a column are connected with a same data line, and pixel switches connected with each pixel in a row are connected with a same scanning line;

wherein the method for image capture comprises:

driving one of the plurality of scanning lines within a driving time; and collecting signals from the plurality of data lines by the signal readout chip periodically with a first period as a signal capture period;

wherein the first period has a same time duration with the driving time, an end time point of an m-th first period coincides with a start time point of an (m+1)-th first period, where m is a positive integer, and an end time point of an n-th driving time coincides with a start time point of an (n+1)-th driving time, where n is a positive integer, wherein the first period comprises a first operation time period, a second operation time period, and a third operation time period, and the method for image capture further comprises:

performing a data line signal clearing operation during the first operation time period;

performing a first signal sampling operation during the second operation time period; and performing a second signal sampling operation during the third operation time period;

wherein an i-th first period starts before an i-th driving time, and an interval between a start time point of the i-th first period and a start time point of the i-th driving time is less than a time duration of the i-th first period and a time duration of the i-th driving time, where i is a positive integer; and the first operation time period and the second operation time period of a j-th first period fall into a (j−1)-th driving time, and the third operation time period of the j-th first period falls into a j-th driving time, wherein j is an integer greater than or equal to 2.

2. The method for image capture according to claim 1, further comprising:

controlling, by a scanning line corresponding to a (k−1)-th driving time, pixel switches of a corresponding row to remain in an on-state during the first operation time period of a k-th first period, so that a signal clearing operation can be performed to pixels in the corresponding row during the first operation time period of the k-th first period, where k is an integer greater than or equal to 2.

3. The method for image capture according to claim 2, further comprising:

performing, by the signal readout chip, a subtraction between a signal obtained by the second signal sampling operation and a signal obtained by the first signal sampling operation to obtain a difference, and outputting the difference as a final signal.

4. The method for image capture according to claim 3, wherein the first period further comprises a signal release time period after the second operation time period and before the third operation time period.

5. The method for image capture according to claim 4, wherein there is a first interval time between a start time point of the first period and the first operation time period, there is a second interval time between the first operation time period and the second operation time period, there is a third interval time between the second operation time period and the third operation time period, there is a fourth interval time between the third operation time period and an end time point of the first period; and the signal release time period falls into the third interval time.

6. The method for image capture according to claim 5, wherein during the signal release time period, 80% or more of electronic signals in pixels of a corresponding row are transmitted to the signal readout chip.

7. The method for image capture according to claim 6, wherein a driving circuit of the plurality of scanning lines is an external driving chip or is integrated in the device layer in a TFT device circuit form.

8. The method for image capture according to claim 7, wherein the signal readout chip is directly bonded to the substrate in a Chip On Glass (COG) way, or the signal readout chip is bonded to an external printed circuit board electrically connected with the TFT flat-panel image sensor.

9. The method for image capture according to claim 7, wherein the external driving chip is directly bonded to the substrate in a COG way, or the external driving chip is bonded to an external printed circuit board electrically connected with the TFT flat-panel image sensor.

* * * * *